United States Patent [19]
Nagai et al.

[11] Patent Number: 5,227,700
[45] Date of Patent: Jul. 13, 1993

[54] ELECTRON ACCELERATOR

[75] Inventors: Kazutoshi Nagai; Tatsuya Nishimura, both of Kanagawa, Japan

[73] Assignee: Ebara Corporation, Tokyo, Japan

[21] Appl. No.: 630,323

[22] Filed: Dec. 19, 1990

[30] Foreign Application Priority Data

Dec. 19, 1989 [JP] Japan ................................ 1-328878

[51] Int. Cl.⁵ .............................................. H01J 29/52
[52] U.S. Cl. .................................. 315/383; 313/337
[58] Field of Search ............... 315/383, 366; 313/337, 313/338, 339, 340, 446, 495

[56] References Cited

U.S. PATENT DOCUMENTS 3,388,280  6/1968  Lucia .
3,864,572  2/1975  van der Mast et al. .
4,167,690  9/1979  Gange ................................ 313/422
4,705,992 11/1987  Ciocan ................................ 315/383

OTHER PUBLICATIONS

"Patent Abstracts of Japan", vol. 12, No. 32 (E-76) [1507], Mar. 29, 1977 Appl. No. 50-51295.

"Patent Abstracts of Japan", vol. 5, No. 55 (E-52) [727], Apr. 16, 1981 Appl. No. 54-80363.

"Development of High Energy Density Heat Source: Electron Beam Gun," Tanaka et al., Ishikawajima-Harima Technical Journal, vol. 27, No. 5, pp. 263-268 (Sep. 1987).

"Recent Development of Electron Processing Systems", Sakamoto et al., Nishin Denki Technical Journal, vol. 25, No. 3, ('80.7), pp. 12-21.

Primary Examiner—Theodore M. Blum
Attorney, Agent, or Firm—Wenderoth, Lind & Ponack

[57] ABSTRACT

An electron accelerator includes a thermal cathode, heated by infrared rays guided by a quartz rod, for emitting electrons, an accelerating section connected to a high voltage power supply, and a vacuum vessel containing the cathode and the acceleration section. The cathode may be heated by laser beam instead of the infrared rays. The current level of an accelerated electron beam is detected to generate a signal proportional to the detected level. The signal is used to adjust the intensity of the rays heating the cathode to prevent the level of electrons emitted from said cathode from fluctuating.

6 Claims, 3 Drawing Sheets

ELECTRON ACCELERATOR

BACKGROUND OF THE INVENTION

1. Field of the Invention

The present invention relates to an electron accelerator for electrostatical acceleration of electrons emitted from a hot cathode provided in a vacuum vessel.

2. Prior Art

Electron accelerators have various industrial uses such as for use in graft polymerization, antipollution devices and material analysis. FIG. 1 shows an example of an electron accelerator. In a vacuum vessel 10, a cathode 1, a truncated-cone-shaped bias electrode 2 disposed just in front of the cathode 1, an extracting electrode 3 having a central aperture for allowing an electron beam to pass therethrough, and a group of electrostatic lenses 4 having central apertures are arranged in the preceding order along a central axis X to produced an accelerated electron beam. At an exit of the accelerates, a titanic film window 5 is formed on a wall of the vacuum vessel 10. The accelerated electron beam is detected at an electron detecting electrode 12, which is set outside the window 5.

A DC high voltage is applied to the extracting electrode 3 and the electrostatic lenses 4 through a series of a resistors 14 across which a DC high voltage power supply 16 is connected. The cathode 1 is heated by an adjustable power supply 18. A DC power supply 20 is connected between the cathode 1 and the bias electrode 2, so that the electrical potential of the bias electrode 2 is lower than that of the cathode 1. The power supply 18 and 20 receive electrical power through an insulating transformer 22 from an AC power supply 24.

When this electron accelerator is driven, the cathode 1 is made red hot and thermal electrons are extracted from the hot cathode 1 by the extracting electrode 3. Since the bias electrode 2 has the central aperture for allowing the electrons to pass and is therethrough at the above-mentioned electric potential, the bias electrode 2 focuses the electron beam through the central portion of the extracting electrode 3. The electron beam then passes through the central apertures of the electrostatic lenses 4 which not only focus but also accelerate for the electron beam. During its passage through the lenses 4, the electron beam is repeatedly converged and accelerated to form an accelerated electron beam and is emitted through the titanic film window 5 to the outside. An electric current proportional to an amount of the electron beam impinging the detecting electrode 12 is converted to an AC current by a DC/AC converter 26. This AC current is fed through an insulating transformer 28 to an AC/DC converter 30 which converts the AC current to a DC current which is then fed back to the power supply 18. This negative feedback loop controls the power supply 18 so that the cathode 1 is heated to a temperature at which the current of the accelerated electron beam remains constant.

It is noted that the detecting electrode 12 can be provided inside the vacuum vessel 10.

In such an electron accelerator, a high voltage power supply is required to obtain a high energy electron beam. For example, a DC high voltage power supply of 1 MV, 100 mA is required to obtain an electron beam of 1 MeV and 100 mA. On the other hand, since the detecting electrode 12 is kept at ground potential, the potential difference between the power supply 18 and the detecting electrode 12 is significantly large. In order to tolerate such a high potential difference, the insulating transformers 22 and 28 have to be substantially large and are, as a result, expensive. In other words, the size and cost of the electron accelerator are both disadvantageous.

SUMMARY OF THE INVENTION

An object of the present invention is to provide an electron accelerator which is compact and capable of stably generating a high energy electron beam at a low cost.

According to the invention, an electron accelerator including a thermal cathode for emitting electrons, an accelerating section connected to a high voltage power supply for accelerating the emitted electrons and a vacuum vessel containing the cathode and the accelerating section further includes:

first means for heating the cathode with infrared light;

second means for detecting the current level of an accelerated electron beam and for generating a signal proportional to the detected level; and third means for feeding the signal back to the first means so as to adjust the intensity of the infrared light to prevent the level of the electrons emitted from the cathode from fluctuating.

In the first embodiment of the present invention, the first means may include an optical ray (such as an infrared ray) source, power supplies for the source and a quartz rod for guiding the ray to heat the thermal cathode, and the second means may include electrodes for detecting an accelerated electron beam, and the third means may feed back the signal from the detecting electrode to the power supplies for the ray source to control the intensity of the light rays to cause the cathode to emit a substantially constant level of electrons.

In the second embodiment of the present invention, the first means may include a laser source and a power supply for the laser source, instead of the infrared ray source and its power supplies of the first embodiment.

The above and other objects and advantages of the invention will become clearer from the following description taken in connection with the accompanying drawings illustrating certain embodiments.

DETAILED DESCRIPTION OF THE PREFERRED EMBODIMENTS

Figure 1:
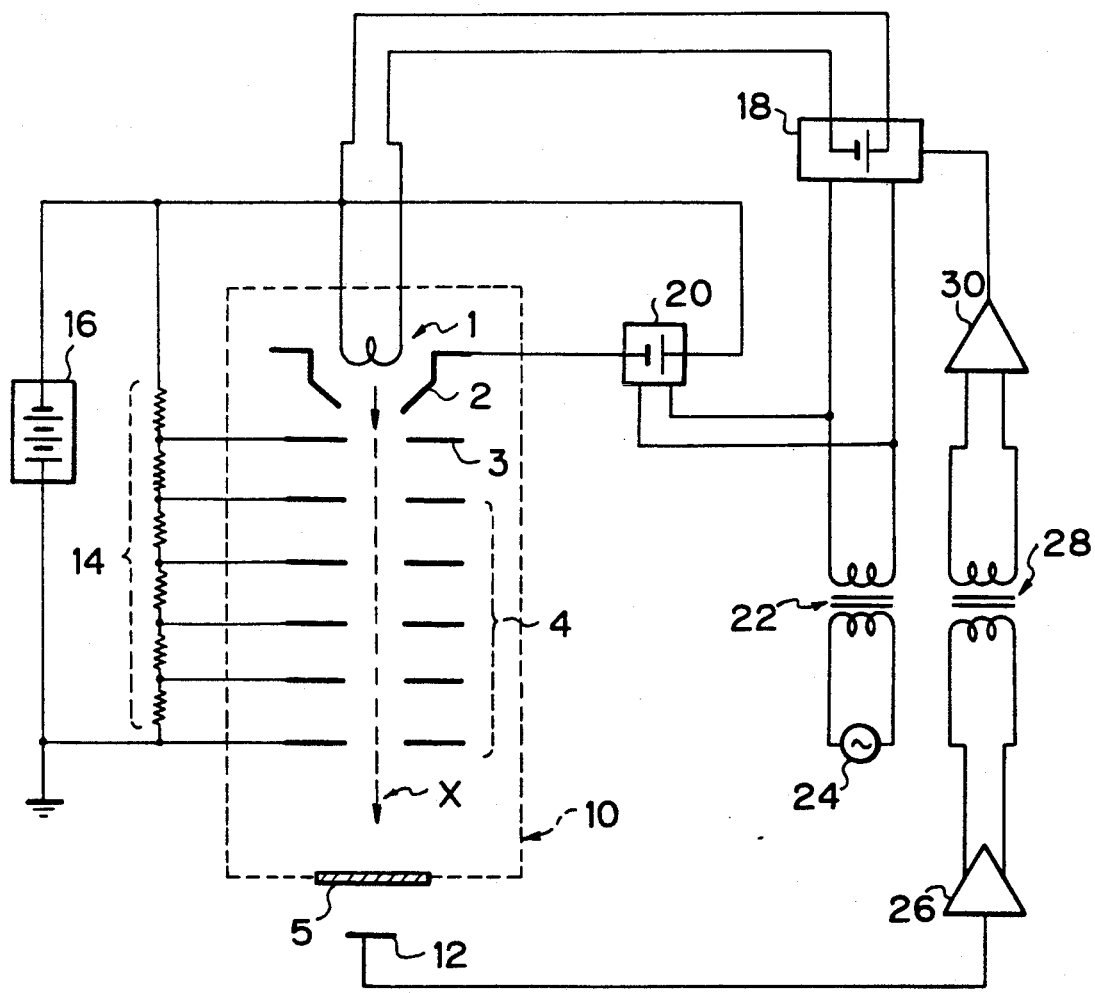
FIG. 1 is a block diagram schematically showing the structure of an electron accelerator of the prior art.
Figure 2:
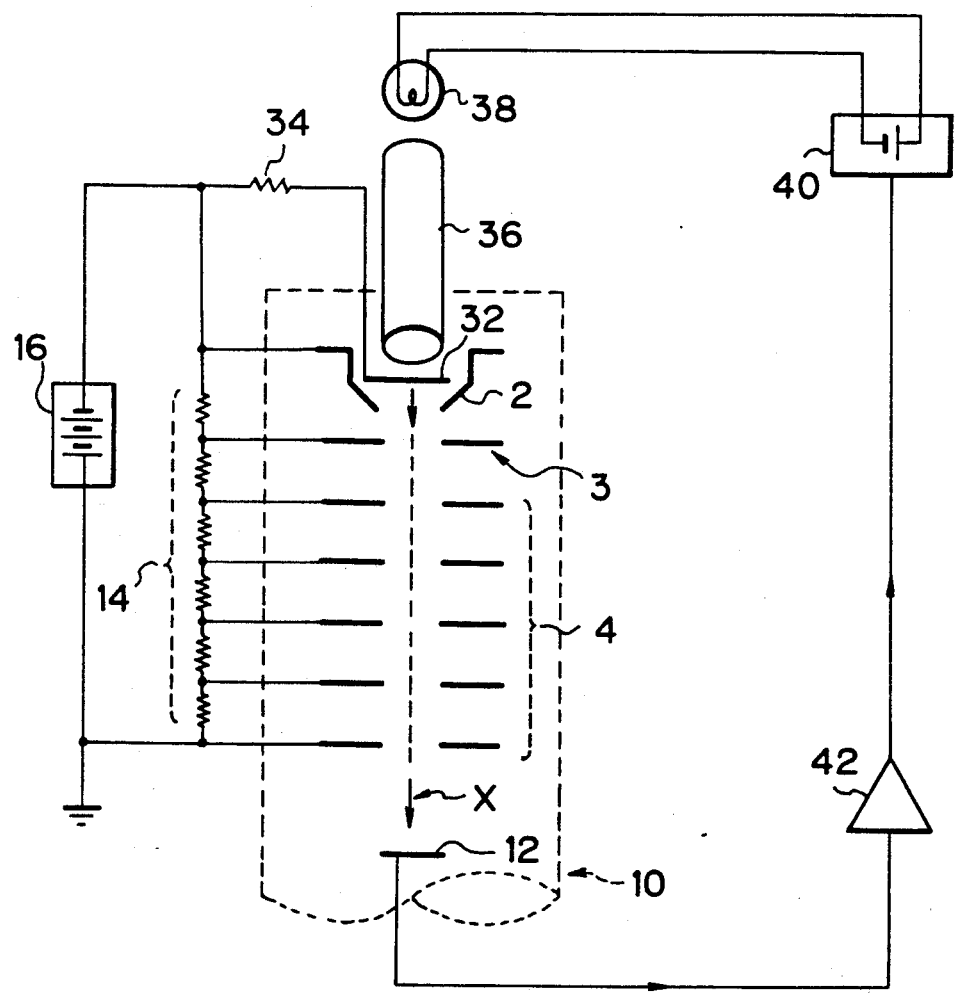
FIG. 2 is a block diagram schematically showing the structure of an embodiment of an electron accelerator according to the present invention.

FIG. 2 schematically shows the first embodiment of an electron accelerator. In this figure, similar or corresponding elements are designated by the same reference numerals as used in FIG. 1 and an explanation thereof is omitted here.

A cathode 32 in the vacuum vessel 10 is composed of an oxide of Br, Sr or Ca, or $LaB_6$. The bias electrode 2 having the central aperture for allowing the electron beam to pass therethrough is disposed adjacent to the surface of the cathode 32. In front of the bias electrode 2, the doughnut-type extracting electrode 3 and the group of electrostatic lenses 4 are arranged along the central axis along which the electron beam travels, and a high voltage is supplied to the electrodes through the divider resistors 14 connected in series to the DC high voltage power supply 16.

A resistor 34 is connected between the cathode 32 and the DC power supply 16. The bias electrode 2 is connected to the DC power supply 16.

A quartz rod 36 is mounted to the vacuum vessel 10 such that one end thereof is immediately adjacent to the cathode 32 and such that the other end thereof protrudes out of the vacuum vessel 10. An infrared lamp 38 is disposed facing the protruding end of the quartz rod 36. The infrared lamp 38 is connected to a power supply 40 to which the detecting electrode 12 feeds back a signal through an amplifier 42.

In operation, an infrared ray emitted from the infrared lamp 38 is guided by the quartz rod 36 by being completely reflected by the inner surface of the quartz rod 36 and illuminates the cathode 32 provided in the vacuum vessel 10, causing the cathode 32 to become red hot. The cathode 32 such as an oxide of Br, Sr and/or Ca or $LaB_6$ emits a great number of thermal electrons when the cathode 32 is heated to 700°–1500° C.

As a high voltage is applied to the extracting anode 3 and the group of electrostatic lenses 4 from the DC high voltage power supply 16, the thermal electrons are first extracted toward the extracting anode 3. The bias electrode 2 is kept at a lower potential by the resistor 34 than the cathode 32 and the emitted electrons are repelled by the bias electrode 2 and consequently limited to a narrow beam. This electron beam passes through the center of the central aperture formed in the bias electrode 2 without expanding and passes to the electrostatic lenses 4 which serve to accelerate the electron beam to form an accelerated electron beam X.

The detecting electrode 12 disposed in a path of the accelerated electron beam in the vacuum vessel 10 generates a signal proportional to the current of the incoming accelerated electron beam. The signal is amplified by the amplifier 42 and fed back to the power supply 40 which then controls the intensity of light emitted from the infrared lamp 38 to adjust the temperature of the thermal cathode 32 so that the current level of the accelerated electron beam may be kept constant.

As can be understood from the foregoing description, in the electron accelerator, a complete electrical insulation is provided between the cathode 32 and the infrared lamp 38 through the quartz rod 36 without any insulating transformer. This enables a feedback loop having a simple structure to be used.

It should be understood that any material capable of transmitting infrared light and having a suitable shape for focusing the infrared light on the cathode 32 can be used instead of the quartz rod 36 in the above described embodiment of the present invention.

Figure 3:
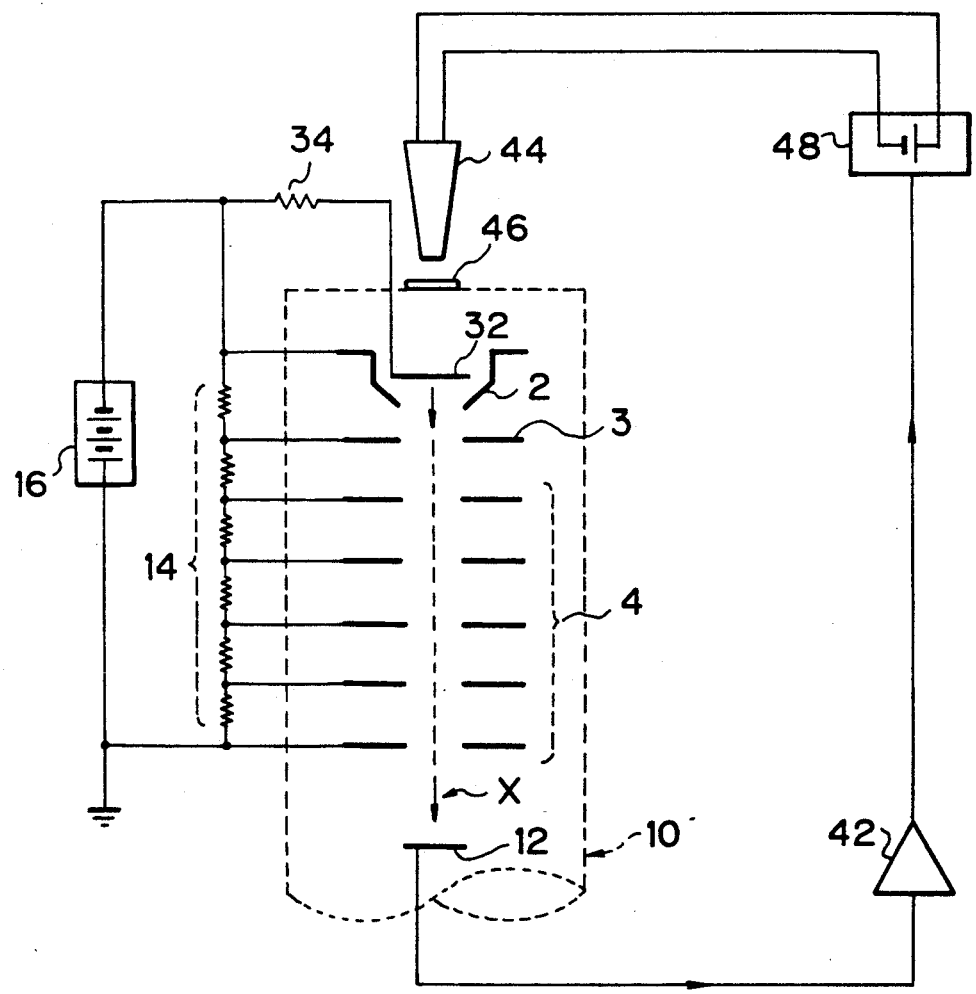
FIG. 3 is a block diagram schematically showing the structure of a second embodiment of the electron accelerator according to the present invention.

FIG. 3 schematically shows the second embodiment of an electron accelerator. In this figure, similar or corresponding elements are designated by the same reference numerals as used in FIG. 2 and an explanation thereof is omitted here.

In the electron accelerator according to this embodiment, the cathode 32 is heated with a laser beam. The accelerator includes a high power laser head 44 and a window 46 mounted on the vacuum vessel 10 instead of the quartz rod 36 and the infrared lamp 38. The laser beam from the high power laser head 44 is guided into the vacuum vessel by window 46. The laser head 44 is connected to power supply 48 which is controlled by the feedback signal from the amplifier 42.

The present invention has been described in detail with particular reference to certain embodiments of the invention, but it is to be understood that modifications and variations can be effected without departing from the scope and spirit of the invention.

What is claimed is:

1. An electron accelerator comprising:
   a thermal cathode which will release electrons when heated to a certain temperature;
   energizable accelerating means operatively associated with said thermal cathode for accelerating electrons released from said cathode;
   a high voltage power supply connected to said accelerating means so as to provide power to energize said accelerating means;
   a vacuum vessel in which a vacuum can be maintained, said vacuum vessel housing said thermal cathode and said accelerating means;
   infrared ray generating means, including a ray source disposed outside of said vacuum vessel and a power supply connected to said ray source, for generating infrared light,
   said infrared ray generating means being adjustable in such a manner that the intensity of the infrared light generated thereby is variable;
   light guide means, disposed between said infrared ray generating means and said thermal cathode in a path coincident with the direction of travel of said infrared light, for guiding the infrared light from said ray source outside of said vacuum vessel into said vacuum vessel toward said thermal cathode, whereby the infrared light generated outside said vacuum vessel is used to heat said thermal cathode to said certain temperature;
   detecting means for detecting a beam of electrons accelerated by said accelerating means and for generating a signal representative of the current of the beam; and
   feedback control means operatively connected to said detecting means and to the power supply of said infrared ray generating means for receiving said signal and for controlling the power supply of said infrared ray generating means to cause said ray source to generate infrared light of an intensity which will prevent the level of electrons released from said thermal electrode from fluctuating.

2. An electron accelerator as claimed in claim 1, wherein said light guide means is a quartz rod.

3. An electron accelerator as claimed in claim 1, wherein said detecting means includes an electrode, and said infrared ray generating means includes an infrared lamp as said ray source whereby said power supply is connected to said infrared lamp.

4. An electron accelerator comprising:
   a thermal cathode which will release electrons when heated to a certain temperature;
   energizable accelerating means operatively associated with said thermal cathode for accelerating electrons released from said cathode;
   a high voltage power supply connected to said accelerating means so as to provide power to energize said accelerating means;
   a vacuum vessel in which a vacuum can be maintained, said vacuum vessel housing said thermal cathode and said accelerating means;

laser beam generating means, including a beam source disposed outside of said vacuum vessel and a power supply connected to said beam source, for generating a laser beam, said laser beam generating means being adjustable in such a manner that the intensity of the laser beam generated thereby is variable;

light guide means, disposed between said laser beam generating means and said thermal cathode in a path coincident with the direction of travel of said laser beam, for guiding the laser beam from outside of said vacuum vessel toward said thermal cathode, whereby the laser beam generated outside said vacuum vessel is used to heat said thermal cathode to said certain temperature;

detecting means for detecting a beam of electrons accelerated by said accelerating means and for generating a signal representative of the current of the beam; and feedback control means operatively connected to said detecting means and to the power supply of said laser beam generating means for receiving said signal and for controlling the power supply of said laser beam generating means to cause said beam source to generate a laser beam of an intensity which will prevent the level of electrons released from said thermal electrode from fluctuating.

5. An electron accelerator as claimed in claim 4, wherein said light guide means is a window transparent to the laser light and extending through said vacuum vessel.

6. An electron accelerator as claimed in claim 4, wherein said detecting means includes an electrode, and said laser beam generating means includes a laser head as said ray source, whereby said power supply is connected to said laser head.

* * * * *